(12) United States Patent
Burberry et al.

(10) Patent No.: US 6,872,500 B2
(45) Date of Patent: Mar. 29, 2005

(54) METHOD OF PATTERNING AN ELECTROCONDUCTIVE LAYER ON A SUPPORT

(75) Inventors: Mitchell S. Burberry, Webster, NY (US); Charles C. Anderson, Penfield, NY (US); Mark Lelental, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/648,421

(22) Filed: Aug. 26, 2003

(65) Prior Publication Data

US 2005/0048406 A1 Mar. 3, 2005

(51) Int. Cl.$^7$ .............................. G03C 8/02; G03C 8/08; G03C 8/26
(52) U.S. Cl. ....................... 430/200; 430/202; 430/964; 428/32.39; 428/32.52
(58) Field of Search ................................ 430/200, 202, 430/964; 428/32.39, 32.52

(56) References Cited

U.S. PATENT DOCUMENTS

| | | | |
|---|---|---|---|
| 4,052,209 | A | 10/1977 | Huffman et al. |
| 5,354,613 | A | 10/1994 | Quintens et al. |
| 5,958,834 | A * | 9/1999 | Yamazaki et al. .......... 503/227 |
| 2003/0129525 | A1 | 7/2003 | Lamotte |
| 2003/0134211 | A1 * | 7/2003 | Lelental et al. ............... 430/62 |

FOREIGN PATENT DOCUMENTS

| | | |
|---|---|---|
| EP | 440 957 A | 3/1996 |
| EP | 1 079 397 A1 | 2/2001 |
| EP | 686 662 A | 11/2002 |
| EP | 1 324 126 A1 | 7/2003 |
| EP | 1 326 260 A1 | 7/2003 |
| WO | 97/18944 | 5/1997 |

OTHER PUBLICATIONS

Physics World, Mar. 1999, P. 25–39.
Synthetic Metals, 22 (1987), p. 265–271, Kubel et al.
Research Disclosure No. 1473 (1998).
Co-pending U.S. Application No. 10–648,419, Lelental et al., Photopatterning of Conductive Electrode Layers Containing Electrically–Conductive Polymer Particles (D–83892).
Co-Pending U.S. Application No. 10/648,418, Lelental et al., Electrographic Patterning of Conductive Electrode Layers Containing Electrically–Conductive Polymer Materials (D–83943).
Co-pending U.S. Application No. 10/648,420, Anderson et al., Patterning of Electrically Conductive Layers by Ink Printing Methods (D–83879).

* cited by examiner

*Primary Examiner*—Richard L. Schilling
(74) *Attorney, Agent, or Firm*—Doreen M. Wells

(57) ABSTRACT

An element for making patterns on an electroconductive substrate, the element comprising a support, on which is disposed: a) a conductive layer containing an electrically conductive polymer, a polyanion and a conductivity enhancing agent; and b) a mixing layer containing a thermally mobile material; wherein, upon imagewise heating the mixing layer, the thermally mobile material mixes with the conductive layer, thereby causing the initial surface resistivity (SR) of the conductive layer to imagewise increase from an initial value $SR_i$, which is lower than $10^5 \Omega$/square, to $SR_i \Delta$, $\Delta$ being at least $10^2$.

43 Claims, No Drawings

METHOD OF PATTERNING AN ELECTROCONDUCTIVE LAYER ON A SUPPORT

CROSS-REFERENCE TO RELATED APPLICATIONS

This application relates to commonly assigned copending application Ser. No. 10/648,419 entitled PHOTOPATTERNING OF CONDUCTIVE ELECTRODE LAYERS CONTAINING ELECTRICALLY-CONDUCTIVE POLYMER PARTICLES, application Ser. No. 10/648,418 entitled ELECTROGRAPHIC PATTERNING OF CONDUCTIVE ELECTRODE LAYERS CONTAINING ELECTRICALL-CONDUCTIVE POLYMERIC MATERIALS, application Ser. No. 10/648,420 entitled PATTERNING OF ELECTRICALLY CONDUCTIVE LAYERS BY INK PRINTING METHODS, filed simultaneously herewith. The copending applications are incorporated by reference herein for all that they contain.

FIELD OF THE INVENTION

The present invention relates to a method for patterning an organic polymer electroconductive layer that is suitable as an electronic circuitry element in an electric or semiconductor device.

BACKGROUND OF THE INVENTION

Electric or semiconductor devices such as flat panel displays, photovoltaic cells or electrochromic windows typically contain a substrate provided with an indium tin oxide (ITO) layer as a transparent electrode. The coating of ITO is carried out by vacuum sputtering methods which involve high temperature conditions up to 250° C., and therefore, glass substrates are generally used. The high cost of the fabrication methods and the low flexibility (pliability) and stretchability of such electrodes, due to the brittleness of the inorganic ITO layer as well as the glass substrate, limit the range of potential applications. As a result, there is a growing interest in making all-organic devices, comprising plastic resins as a substrate and organic electroconductive polymer layers as an electrode. Such plastic electronics allow low cost devices with new properties (Physics World, March 1999, p.25–39). Flexible plastic substrates can be provided with an electroconductive polymer layer by continuous roller coating methods (compared to batch process such as sputtering) and the resulting organic electrodes enable the fabrication of electronic devices characterized by a higher flexibility and a lower weight.

The production and the use of electroconductive polymers such as polypyrrole, polyaniline, polyacetylene, polyparaphenylene, polythiophene, polyphenylenevinylene, polythienylenevinylene and polyphenylenesulfide are well known in the art. EP-A-440 957 describes a method for preparing polythiophene in an aqueous mixture by oxidative polymerization in the presence of a polyanion as a doping agent. In EP-A-686 662 it has been disclosed that highly conductive layers of polythiophene, coated from an aqueous coating solution, could be made by the addition of a di- or polyhydroxy and/or a carbonic acid, amide or lactam group containing compound in the coating solution of the polythiophene layer and by keeping the coated layer at elevated temperature, preferably between 100 and 250° C., during preferably 1 to 90 seconds.

Coated layers of organic electroconductive polymers can be structured into patterns using the known wet-etching microlithography techniques. WO97/18944 describes a process wherein a positive or negative photoresist is applied on top of a coated layer of an organic electroconductive polymer, and after the steps of selectively exposing the photoresist to UV light, developing the photoresist, etching the electroconductive polymer layer and finally stripping the non-developed photoresist, a patterned layer is obtained. A similar technique has been described in Synthetic Metals, 22 (1988), p. 265–271 for the design of an all-organic thin-film transistor. Such methods are cumbersome as they involve many steps and require the use of hazardous chemicals. Research Disclosure No. 1473 (1998) describes photoablation as a method suitable for patterning organic electroconductive polymer layers, wherein the selected areas are removed from the substrate by laser irradiation. Such photoablation processes are convenient, dry, one-step methods but the generation of debris still requires a wet cleaning step and may contaminate the optics and mechanics of the laser structuring device. Some prior art methods also induce a difference of the optical density between electroconductive and non-conductive areas of the patterned surface, which should be avoided. Methods of patterning organic electroconductive polymer layers by image-wise heating by means of a laser have been disclosed in EP 1 079 397 A1. That method induces a decrease in resistivity without substantially ablating or destroying the layer. It is limited however to modest changes of resistivity between imaged and unimaged areas of about 3 orders of magnitude.

SUMMARY OF THE INVENTION

It is an object of the present invention to provide a convenient, dry, one-step method of patterning an electroconductive organic polymer layer which does not require a wet cleaning step, has little influence on the optical density of the polymer layer, has very high contrast between conductive and resistive regions and does not require the removal of the conductive layer.

A method of patterning an electroconductive layer on a support is disclosed. The support is provided with a mixing layer containing a thermally mobile material, and a conductive polymer layer containing a polythiophene, polyanion and a di- or polyhydroxy organic compound. The conductive layer is characterized by an initial surface resistivity ($SR_i$) having a value that is lower than $10^4 \Omega$/square. By heating selective areas of the mixing layer the surface resistivity of these areas is increased to $SR_i\Delta$ wherein $\Delta$ is at least $10^3$, preferably at least $10^5$ and more preferable at least $10^8$. The electroconductive pattern thus obtained can be used as an electronic circuit for making an electronic or semiconductor device such as a printed circuit board, an integrated circuit, a display, an electroluminescent device or a photovoltaic cell.

The invention provides:

An element for making patterns on an electroconductive substrate, the element comprising a support, on which is disposed:

a) a conductive layer containing an electrically conductive polymer, a polyanion and a conductivity enhancing agent; and b) a mixing layer containing a thermally mobile material; wherein, upon imagewise heating the mixing layer, the thermally mobile material mixes with the conductive layer, thereby causing the initial surface resistivity (SR) of the conductive layer to imagewise increase from an initial value $SR_i$, which is lower than $10^5$ $\Omega$/square, to $SR_i\Delta$, $\Delta$ being at least $10^2$.

Also provided is a method of patterning an electroconductive layer on a support, the support having thereon a mixing layer containing a thermally mobile material and a conductive polymer layer containing a polythiophene), a polyanion and a di- or polyhydroxy organic compound, whereby the mixing layer is heated image-wise in selected areas, causing the thermally mobile material to mix with the conductive layer, wherein;

the surface resistivity (SR) of the conductive layer is decreased or increased from an initial value $SR_i$, which is lower than $10^5$ Ω/square to $SR_i\Delta$, $\Delta$ being at least $10^2$ in said selected areas without substantially ablating or destroying the polymer layers.

Further advantages and embodiments of the present invention will become apparent from the following description and examples.

DETAILED DESCRIPTION OF THE INVENTION

All values of surface resistivity (SR) presented in this document are measured at 20° C. and 50% relative humidity according to the two-point probe method using knife edge electrodes approximately 1 inch long with a 0.25 inch spacing between the electrodes.

In this method of patterning an electroconductive polymer layer, a support is provided with a mixing layer containing a thermally mobile material and a conductive layer containing a polythiophene, a polyanion and a di- or polyhydroxy organic compound whereby; the mixing layer is selectively heated, causing the thermally mobile material to mix with the conductive layer, wherein the surface resistivity (SR) of the conductive layer is increased at said selected areas from an initial value $SR_i$, which is lower than $10^5$ Ω/square to $SR_i\Delta$, $\Delta$ being at least $10^2$, preferably at least $10^5$ and more preferable at least $10^8$ without substantially ablating, removing or destroying the polymer layers. The mixing layer can be provided with a polymeric matrix to contain the thermally mobile material. In one embodiment the mixing layer is heated by means of a resistive head array. In a more preferred embodiment the mixing layer is also provided with a light-to-heat converting material such as a dye, IR dye or pigment and the layer is heated by means of a focused laser beam. In this embodiment the mixing layer is heated by means of a focused laser beam.

The polymeric matrix in which the thermally mobile material used in the invention is suspended can be any polymer material that resists diffusion of the thermally mobile material at room temperature. Matrix materials useful in the invention include organic or inorganic polymers. Polymers which can be used in the invention include the following: poly(vinyl chloride), poly(vinylidene chloride), poly(vinyl chloride-co-vinylidene chlorides, chlorinated polypropylene, poly(vinyl chloride-co-vinyl acetate), poly(vinyl chloride-co-vinyl acetate-co-maleic anhydride), ethyl cellulose, cellulose acetate propionate, nitrocellulose, poly(acrylic acid) esters, linseed oil-modified alkyd resins, rosin-modified alkyd resins, phenol-modified alkyd resins, phenolic resins, polyesters, polyisocyanate resins, polyurethanes, poly(vinyl acetate), polyamides, chroman resins, gum damar, ketone resins, maleic acid resins, polyvinylacetal, polyvinylbutyral, vinyl polymers such as polystyrene and polyvinyltoluene or copolymers of vinyl polymers with methacrylates or acrylates, low-molecular weight polyethylene, phenol-modified pentaerythritol esters, poly(styrene-co-indene co-acrylonitrile), poly(styrene-co-indene), poly(styrene-co-acrylonitrile), copolymers with siloxanes, polyalkenes and poly(styrene-co-butadiene), cross-linked gelatin, xanthum gum (available commercially as Keltrol® from Kelco-Merck Co.), poly(vinyl alcohol), polyester ionmers, polyglycols, polyacrylamides, polyalkylidene-etherglycols, polyacrylates, etc. The above matrix materials may be used either alone or in combination. To increase the cohesion of the matrix layer, polymers which are crosslinked or branched can be used such as poly(styrene-co-indene-co-divinylbenzene), poly(styrene-co-acrylonitrile-co-divinylbenzene), poly(styrene-co-butadiene-co-divinylbenzene), etc.

Thermally mobile materials useful in the invention include both pigments and dyes. Pigments which can be used in the invention are desirably meltable or diffusible in the polymer matrix and include the following: organic pigments such as metal phthalocyanines, e.g., copper phthalocyanine, quinacridones, epindolidiones, Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monstral® Blue G (C.I. No. Pigment Blue 15); Monstral® Blue BT 383D (C.I. No. Pigment Blue 15); Monstral® Blue G BT 284D (C.I. No. Pigment Blue 15); Monstral® Green GT 751D (C.I. No. Pigment Green 7) or any of the materials disclosed in U.S. Pat. Nos. 5,171,650, 5,672,458 or 5,516,622, the disclosures of which are hereby incorporated by reference. Dyes useful in the invention include the following: Anthraquinone dyes, e.g., Sumikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM®, and KST Black146® (products of Nippon Kayaku Co., Ltd.); azo dyes such as Kayalon Polyol Brilliant Blue BM®, Kayalon Polyol Dark Blue 2BM, and KST Black KR® (products of Nippon Kayaku Co., Ltd.), Sumikaron Diazo Black 5G® (product of Sumitomo Chemical Co., Ltd.), and Miktazol Black5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.); or any of the dyes disclosed in U.S. Pat. Nos. 4,541,830; 4,698,651; 4,695,287; 4,701,439; 4,757,046; 4,743,582; 4,769,360 and 4,753,922, the disclosures of which are hereby incorporated by reference. The above dyes may be employed singly or in combination. Combinations of pigments and/or dyes can also be used. The above dyes are thermally-diffusible or meltable. The use of a mixture of thermally mobile materials can also provide additional advantages such as altering some of the physical properties (e.g., lowering the melting point).

In a most preferred embodiment the polymeric matrix is itself a colorless thermally-mobile material such as a low critical temperature polymer. Examples of such colorless thermally mobile polymeric materials have recurring units of the following formula:

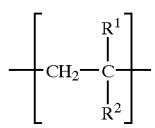

wherein:

R¹ represents cyano, isocyanate, azide, sulfonyl, nitro, phosphoric, phosphonyl, heteroaryl, or

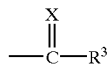

where
X is O, S, NR, or N⁺ (R)₂;
R³ is R, OR, O—M⁺, OCOOR, SR, NHCOR, NHCON (R)₂, N(R)₂ or N⁺ (R)₃;
M⁺ is an alkali or ammonium moiety;
R is hydrogen, halogen, or an alkyl or cycloalkyl group; and
R² is hydrogen, alkyl or from the same list as R¹;
such that upon image-wise heating the thermally mobile polymeric material is mixed into the conductive layer.

Photopatternable conductive layers useful in the present invention may be prepared from aqueous or solvent based coating compositions containing an electrically conductive polymer, a conductivity enhancing compound, and optionally, a film-forming polymeric binder. These coating compositions can be applied as thin layers to the substrate or the mixing layer and by drying can be converted into photopatternable conductive layer elements. For improved conductivities the dried, photopatternable conductive layer may be annealed at temperatures of 140° C. or higher for 10 seconds up to about 10 minutes.

Preferred electrically conductive polymers for use in the present invention include polypyrrole/poly (styrene sulfonic acid), 3,4-dialkoxy substituted polypyrrole styrene sulfonate, and 3,4-dialkoxy substituted polythiophene styrene sulfonate. Especially preferred electrically conductive polymers are polythiophene of formula (I)

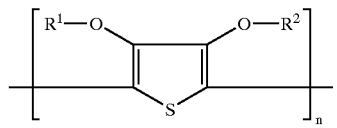

wherein each of R1 and R2 independently represents hydrogen or a C1–4 alkyl group or together represent an optionally substituted C1–4 alkylene group or a cycloalkylene group, preferably an ethylene group, an optionally alkyl-substituted methylene group, an optionally C1–12 alkyl- or phenyl-substituted 1,2-ethylene group, a 1,3-propylene group or a 1,2-cyclohexylene group and n is 5–1000.

Stable colloidal dispersions of suitable electronically conductive polymer particles can be obtained commercially, for example, a stabilized dispersion of thiophene-containing polymer supplied by Bayer Corporation as Baytron P.

The conductivity enhancing modifier used in the invention include organic compounds containing dihydroxy or poly-hydroxy and/or carboxyl groups or amide groups or lactam groups. Suitable organic compounds containing dihydroxy or polyhydroxy and/or carboxyl groups or amide groups correspond to (a) formula (II)

$$(OH)_n-R-(COX)_m \quad (II)$$

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or (b) a sugar, sugar derivative, polyalkylene glycol, or glycerol compound; or (c) selected from the group consisting of N-methylpyrrolidone, pyrrolidone, caprolactam, N-methyl caprolactam, or N-octylpyrrolidone.

Examples of suitable organic compounds containing lactam groups are n-methylpyrrolidone, pyrrolidone, caprolactam, n-methylcaprolactam, n-octylpyrrolidone.

Preferred radicals R are derived from the furan structure or the pyran structure. Particularly preferred organic compounds) are: sugar and sugar derivatives such as sucrose, glucose, fructose, lactose; sugar alcohols such as sorbitol, mannitol; furan derivatives such as 2-furancarboxylic acid, 3-furancarboxylic acid; alcohols such as ethylene glycol, glycerol, di- or triethylene glycol.

Polymeric film-forming binders useful in photopatternable conductive layers according to this invention include, but are not limited to, water-soluble or water-dispersible hydrophilic polymers such as gelatin, gelatin derivatives, maleic acid anhydride copolymers, cellulose derivatives (such as carboxymethyl cellulose, bydroxyethyl cellulose, cellulose acetate butyrate, diacetyl cellulose, and triacetyl cellulose), synthetic hydrophilic polymers (such as polyvinyl alcohol, poly-N-vinylpyrrolidone, acrylic acid copolymers, polyacrylamide, their derivatives and partially hydrolyzed products, vinyl polymers and copolymers such as polyvinyl acetate and polyacrylate acid ester), derivatives of the above noted polymers, and other hydrophilic synthetic resins that would be readily apparent to one skilled in the imaging arts. Other suitable binders include aqueous emulsions of addition-type polymers and interpolymers prepared from ethylenically unsaturated polymerizable monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes or polyesterionomers.

Solvents useful for preparing dispersions and coatings of photopatternable conductive layers by the method of this invention include, but are not limited to water, alcohols (such as methanol, ethanol, propanol, and isopropanol), ketones (such as acetone, methyl ethyl ketone, and methyl isobutyl ketone), esters such as methyl acetate and ethyl acetate, glycol ethers such as methyl cellusolve, ethyl cellusolve), and mixtures of any of these solvents. Preferred solvents include water, alcohols, and acetone.

In addition to binders and solvents, other components that are well known in the art may also be included in the photopatternable conductive layer used in this invention. Such addenda include but are not limited to matting agents, surfactants or coating aids, polymer lattices to improve dimensional stability, thickeners or viscosity modifiers, hardeners or crosslinking agents, soluble antistatic agents, soluble and/or solid particle dyes, antifoggants, lubricating agents, and various other conventional additives readily apparent to one skilled in the art.

The photopatternable conductive layers can be applied to a variety of flexible or rigid supports. The flexible supports are preferable embodiments of this invention. Typical flexible film supports are preferred and include but are not limited to, cellulose nitrate, cellulose acetate, cellulose acetate butyrate, cellulose acetate propionate, poly(vinyl acetal), poly(carbonate), poly(styrene), poly(ethylene terephthalate), poly(ethylene naphthalate), poly(ethylene terephthalate), and poly(ethylene naphthalate) having included therein a portion of isophthalic acid, 1,4-cyclohexane dicarboxylic acid or 4,4-biphenyl dicarboxylic acid used in the preparation of the film support; polyesters wherein other glycols are employed such as, for example, cyclohexanedimethanol, 1,4-butanediol, diethylene glycol, polyethylene glycol, ionomers as described in U.S. Pat. No. 5,138,024, incorporated herein by reference (such as polyester ionomers prepared using a portion of the diacid in the form of 5-sodiosulfo-1,3-isophthalic acid or like ion containing monomers), polycarbonates, and blends or laminates of the above noted polymers. Preferred photographic film supports are cellulose acetate, poly(ethylene terephthalate), and poly(ethylene naphthalate),and most preferably poly(ethylene naphthalate) that is prepared from 2,6-naphthalene dicarboxylic acids or derivatives thereof.

Suitable supports can be either transparent or opaque depending upon the application. Transparent film supports can be either colorless or colored by the addition of a dye or pigment. Film supports can be surface-treated by various processes including corona discharge, glow discharge, UV exposure, flame treatment, e-beam treatment, or treatment with adhesion-promoting agents including dichloro- and trichloroacetic acid, phenol derivatives such as resorcinol and p-chloro-m-cresol, solvent washing or overcoated with adhesion promoting primer or tie layers containing polymers such as vinylidene chloride-containing copolymers, butadiene-based copolymers, glycidyl acrylate or methacrylate-containing copolymers, maleic anhydride-containing copolymers, condensation polymers such as polyesters, polyamides, polyurethanes, polycarbonates, and mixtures and blends thereof. Other suitable opaque or reflective supports are paper, polymer-coated papers, including polyethylene-, polypropylene-, and ethylene-butylene copolymer-coated or laminated paper, synthetic papers, and pigment-containing polyesters. Of these support materials, films of cellulose triacetate, poly(ethylene terephthalate), and poly(ethylene naphthalate) prepared from 2,6-naphthalene dicarboxylic acids or derivatives thereof are preferred.

The thickness of the support is not particularly critical. Support thickness of 0.50 to 10 mils (50 μm to 254 μm) are generally suitable for the materials of the present invention.

Coating compositions for the preparation of photopatternable conductive layers can be applied to the aforementioned supports by any of a variety of well-known coating methods. Hand coating techniques include using a coating rod or knife or a doctor blade. Machine coating methods include air doctor coating, reverse roll coating, gravure coating, curtain coating, bead coating, slide hopper coating, extrusion coating, spin coating and the like, and other coating methods well known in the art.

The photopatternable conductive layer formulations of this invention can be applied to the support at any suitable coverage depending on the specific requirements of a particular application. For example, dry coating weights of the preferred electrically conductive polymer particles dispersion in a photopatternable conductive layer are preferably in the range of from about 0.002 to about 0.5 g/m2. More preferred dry coverage is in the range of from about 0.003 to about 0.1 g/m2.

The method of the invention relies on mixing of the thermally mobile material into the conductive layer. The change in the resistivity of the conductive layer may result from the mobile material affecting the inherent conductive properties of the conductive polymer or as a result of physical dilution of the conductive polymer in the layer thereby disrupting the original conductive network. There is usually a certain temperature threshold below which the mobile materials are unaffected. Thus under ambient conditions, where the mixing layer may absorb incident light, no change is induced because the amount of heat generated from this process is spread out over a long period of time so that the threshold for the mobile material diffusion is not reached. To obtain a laser-induced resistivity change according to the invention, an infrared diode laser is preferably employed since it offers substantial advantages in terms of its small size, low cost, stability, reliability, ruggedness, and ease of modulation. Lasers which can be used in the invention are available commercially. There can be employed, for example, Laser Model SDL-2420-H2 from Spectra Diode Labs, or Laser Model SLD 304 V/W from Sony Corp.

A thermal printer which uses a laser as described above to form an image on a thermal print medium is described and claimed in U.S. Pat. No. 5,168,288, the disclosure of which is hereby incorporated by reference.

The following examples are provided to illustrate the invention.

EXAMPLE 1

A 0.1 mm polyester support was overcoated with 0.054 g/m$^2$ of IR absorbing dye (IR Dye-1 below) and 0.38 g/m$^2$ of polymethycyanoacrylate, molecular weight of about 50,000, from acetonitrile, with 0.004 g/m$^2$ of FC 431 surfactant (obtained from 3M Corporation) to improve coating uniformity. The dried coating was then overcoated with a layer containing 0.15 g/m$^2$ of polyethylenedioxythiophene conductive polymer (Baytron P, Bayer Corp), 0.075 g/m$^2$ of polyvinyl alcohol as a binder, and 0.004 g/m$^2$ of an epoxy silane (CoatoSil 1770 is made by OSi Specialties, a subsidiary of Witco Corp.) applied from an aqueous formulation containing 5 weight % diethylene glycol added as a conductivity enhancing compound. The coating was dried for 2 minutes at 100

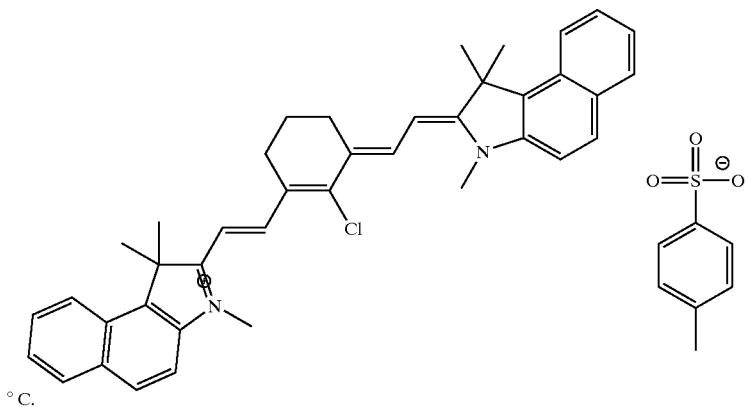

°C.

The film was exposed to a focused laser beam having an approximate diameter of 25 μm ($1/e^2$) and 450 mW per channel at the film plane. Solid areas of 2.54 cm wide were exposed with a series of drum speeds giving effective exposures as listed in table 1. The resistivity was measured with a two-point probe in each exposed area and is also listed in table 1.

TABLE 1

Resistivity versus Exposure

| Exposure (mJ/cm²) | Example 1 (Ω/square) |
|---|---|
| 2288 | >1.0E+12 |
| 1144 | >1.0E+12 |
| 763 | >1.0E+12 |
| 572 | >1.0E+12 |
| 458 | >1.0E+12 |
| 381 | >1.0E+12 |
| 327 | >1.0E+12 |
| 286 | 8.0E+03 |
| 0 | 4.0E+03 |

The resistivity of the unexposed film was low (about $4 \times 10^3$ Ω/square) Above a threshold exposure (approximately 280 mJ/cm² for example 1) a partial increase in resistivity is observed. At very high exposure (above 1000 mJ/cm²) the layers of film are clearly ablated and the resistivity reaches the limiting value of the support. Examination of the film, exposed at intermediate exposures (300 to 500 mJ/cm²), shows that the resistivity reaches the limiting value before the conductive layer is ablated. Thus, with optimal exposure the resistivity of the exposed area can be increased by a factor, Δ, that is at least 8 orders of magnitude higher than the unexposed areas without removing the conductive layer.

What is claimed is:

1. An element for making patterns on an electroconductive substrate, the element comprising a support, on which is disposed:
   a) a conductive layer containing an electrically conductive polymer, a polyanion and a conductivity enhancing agent; and
   b) a mixing layer containing a thermally mobile material; wherein, upon imagewise heating the mixing layer, the thermally mobile material mixes with the conductive layer, thereby causing the initial surface resistivity (SR) of the conductive layer to imagewise increase from an initial value $SR_i$, which is lower than $10^5$ Ω/square, to $SR_i\Delta$, Δ being at least $10^2$.

2. The element of claim 1 patterned for use in an electronic or semiconductor device.

3. The element of claim 1 patterned for use as a printed circuit board, an integrated circuit, a display, an electroluminescent device or a photovoltaic cell.

4. The element of claim 1 wherein the thermally mobile material is contained in a polymeric matrix.

5. The element of claim 4 wherein the polymeric matrix comprises a crosslinked or branched polymer.

6. The element of claim 5 wherein the crosslinked polymer is poly(styrene-co-indene-co-divinylbenzene), poly (styrene-co-acrylonitrile-co-divinylbenzene), poly(styrene-co-butadiene-co-divinylbenzene).

7. The element of claim 1 wherein the thermally mobile material is a pigment, a dye, or a combination of both.

8. The element of claim 4 wherein the polymeric matrix is a thermally mobile material.

9. The element of claim 1 wherein the thermally mobile material has recurring units of the following formula:

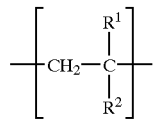

wherein:
R¹ represents cyano, isocyanate, azide, sulfonyl, nitro, phosphoric, phosphonyl, heteroaryl, or

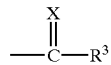

where
X is O, S, NR, or N⁺ (R)₂;
R³ is R, OR, O—M⁺, OCOOR, SR, NHCOR, NHCON (R)₂, N(R)₂ or N⁺ (R)₃;
M⁺ is an alkali or ammonium moiety;
R is hydrogen, halogen, or an alkyl or cycloalkyl group; and
R² is hydrogen, alkyl or from the same list as R¹.

10. The element of claim 1 wherein the conductive layer contains an optional film-forming polymeric binder.

11. The element of claim 1 wherein the conductivity enhancing agent is an organic compound containing dihydroxy, poly-hydroxy, carboxyl, amide, or lactam groups.

12. The element of claim 11 wherein the organic compound containing dihydroxy, poly-hydroxy, carboxyl, amide, or lactam groups is:

(a) represented by the following Formula II:

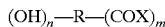

(OH)$_n$—R—(COX)$_m$    II wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or (b) a sugar, sugar derivative, polyalkylene glycol, or glycerol compound; or (c) selected from the group consisting of N-methylpyrrolidone, pyrrolidone, caprolactam, N-methyl caprolactam, or N-octylpyrrolidone.

13. The element of claim 1 wherein said conductivity enhancing agent is a N-methylpyrrolidone, pyrrolidone, caprolactam, N-methylcaprolactam, N-octylpyrrolidone, sucrose, glucose, fructose, lactose, sugar alcohol, 2-furan carboxylic acid, 3-furan carboxylic acid, sorbitol, glycol, ethylene glycol, glycerol, diethylene glycol, or triethylene glycol, or a mixture of any two or more of these compounds.

14. The element of claim 1 wherein said conductivity enhancing agent is N-methylpyrrolidone, pyrrolidone, caprolactam, N-methyl caprolactam, or N-octylpyrrolidone.

15. The element of claim 1 wherein said conductivity enhancing agent is ethylene glycol, diethylene glycol or glycerol.

16. The element of claim 1 wherein said conductivity enhancing agent is one or more than one compound selected from the group consisting of N-methylpyrrolidone, sorbitol, ethylene glycol, glycerol, and diethylene glycol.

17. The element of claim 12, wherein n and m independently of one another denote an integer from 2 to 8.

18. The element of claim 11 wherein the organic compound containing lactam groups is n-methylpyrrolidone, pyrrolidone, caprolactam, n-methylcaprolactam, or n-octylpyrrolidone.

19. The element of claim 12 wherein the conductivity enhancing agent is sucrose, glucose, fructose, lactose, sorbitol, mannitol, 2-furancarboxylic acid, 3-furancarboxylic acid, ethylene glycol, glycerol, di- or triethylene glycol. solution.

20. The element of claim 1 wherein the conductive polymer is a substituted or unsubstituted pyrrole-containing polymer, a substituted or unsubstituted thiophene-containing polymer, or a substituted or unsubstituted aniline-containing polymer.

21. The element of claim 1 wherein the layer containing the conductive polymer contains 10 to 1000 mg/m² dry coating weight of the conductive polymer.

22. The element of claim 1 wherein the layer containing the conductive polymer contains 20 to 500 mg/m² dry coating weight of the conductive polymer.

23. The element of claim 1 wherein the layer containing the conductive polymer comprises a mixture containing:

a) a polythiophene according to Formula I;

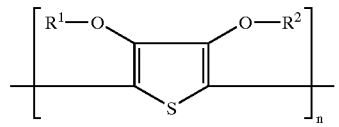

wherein each of R¹ and R² independently represents hydrogen or a C1–C4 alkyl group or together represent an optionally substituted C1–C4 alkylene group or a cycloalkylene group, preferably an ethylene group, an optionally alkyl-substituted methylene group, an optionally C1–C12 alkyl- or phenyl-substituted 1,2-ethylene group, a 1,3-propylene group or a 1,2-cyclohexylene group, and n is 5–1000;

b) a polyanion compound; and, optionally c) a film forming polymeric binder.

24. The element of claim 23 wherein the polyanion is an anion of a polymeric carboxylic acid.

25. The element of claim 23 wherein the polyanion is a polyacrylic acid, a poly(methacrylic acid), a poly(maleic acid), or a polymeric sulfonic acid.

26. The element of claim 23 wherein the polyanion is a polystyrenesulfonic acid or a polyvinylsulfonic acid.

27. The element of claim 23 wherein the film-forming polymeric binder comprises from 5 to 95 wt % of the layer containing the conductive polymer.

28. The element of claim 23 wherein the film-forming polymeric binder is selected from the group consisting of water-soluble or water-dispersible hydrophilic polymers, maleic acid or maleic anhydride copolymers, cellulose derivatives, polyvinyl alcohol, and poly-N-vinylpyrrolidone.

29. The element of claim 23 wherein the film-forming polymeric binder is gelatin or gelatin derivatives.

30. The element of claim 23 wherein the film-forming polymeric binder is carboxymethyl cellulose, hydroxyethyl cellulose, cellulose acetate butyrate, diacetyl cellulose, or triacetyl cellulose.

31. The element of claim 23 wherein the film-forming polymeric binder is an aqueous emulsion of addition-type homopolymers and copolymers prepared from ethylenically unsaturated monomers.

32. The element of claim 31 wherein the monomers are selected from the group consisting of acrylates, methacrylates, acrylamides, methacrylamides, itaconic acid and its half-esters and diesters, substituted and unsubstituted styrenes, acrylonitrile, methacrylonitrile, vinyl acetates, vinyl ethers, vinyl and vinylidene halides, and olefins.

33. The element of claim 23 wherein the film-forming polymeric binder is an aqueous dispersion of polyurethanes or polyesterionomers.

34. The element of claim 1 wherein the support is transparent, opaque, or reflective.

35. The element of claim 1 wherein the support is glass, a polymeric film, paper, silicon wafers, or glass reinforced epoxy.

36. The element of claim 35 wherein the polymeric film support is polyester, polycarbonate, polystyrene, cellulose esters, or polyolefins.

37. The element of claim 1 wherein the support is flexible or rigid.

38. The element of claim 1 wherein the support comprises cellulose acetate, poly(ethylene terephthalate) or poly(ethylene naphthalate).

39. The element of claim 1 wherein the support is surface-treated.

40. The element of claim 1 wherein the support is between 50 μm and 254 μm thick.

41. The element of claim 1 wherein the dry coverage of the conductive layer is between 0.002 and 0.5 g/m2.

42. The element of claim 1 wherein the conductive layer is coated from a dispersion of a conductive polymer in water, alcohol or acetone.

43. A method of patterning an electroconductive layer on a support, the support having thereon a mixing layer containing a thermally mobile material and a conductive polymer layer containing a polythiophene), a polyanion and a di- or polyhydroxy organic compound, whereby the mixing layer is heated image-wise in selected areas, causing the thermally mobile material to mix with the conductive layer, wherein;

the surface resistivity (SR) of the conductive layer is decreased or increased from an initial value $SR_i$, which is lower than $10^4$ Ω/square to $SR_i \Delta$, $\Delta$ being at least $10^3$ in said selected areas without substantially ablating or destroying the polymer layers.

* * * * *